(12) United States Patent
Li et al.

(10) Patent No.: US 10,705,910 B2
(45) Date of Patent: Jul. 7, 2020

(54) METHOD AND APPARATUS FOR OPERATING A DATA STORAGE SYSTEM

(71) Applicant: ALIBABA GROUP HOLDING LIMITED, George Town, Grand Cayman (KY)

(72) Inventors: Shu Li, Santa Clara, CA (US); Xiaowei Jiang, San Mateo, CA (US)

(73) Assignee: ALIBABA GROUP HOLDING LIMITED, Grand Cayman (KY)

( * ) Notice: Subject to any disclaimer, the term of this patent is extended or adjusted under 35 U.S.C. 154(b) by 0 days.

(21) Appl. No.: 15/626,049

(22) Filed: Jun. 16, 2017

(65) Prior Publication Data

US 2018/0365103 A1    Dec. 20, 2018

(51) Int. Cl.
| | | |
|---|---|---|
| *G11C 29/00* | (2006.01) | |
| *G06F 11/10* | (2006.01) | |
| *H03M 13/00* | (2006.01) | |
| *H03M 13/37* | (2006.01) | |
| *H03M 13/29* | (2006.01) | |
| *H03M 13/11* | (2006.01) | |
| *H03M 13/15* | (2006.01) | |

(52) U.S. Cl.
CPC ..... *G06F 11/1076* (2013.01); *H03M 13/2906* (2013.01); *H03M 13/2927* (2013.01); *H03M 13/3715* (2013.01); *H03M 13/616* (2013.01); *H03M 13/1102* (2013.01); *H03M 13/1515* (2013.01)

(58) Field of Classification Search
CPC .......... G06F 11/1076; H03M 13/1102; H03M 13/616
See application file for complete search history.

(56) References Cited

U.S. PATENT DOCUMENTS

| | | | | |
|---|---|---|---|---|
| 2012/0027134 A1* | 2/2012 | Gladwin | ............... | H04L 1/0045 375/340 |
| 2012/0221920 A1* | 8/2012 | Blaum | .................. | G06F 11/108 714/758 |
| 2015/0205527 A1* | 7/2015 | Cohen | .................... | G11C 29/52 711/103 |
| 2016/0306694 A1* | 10/2016 | Tai | .................... | H03M 13/2957 |

* cited by examiner

*Primary Examiner* — Samir W Rizk
(74) *Attorney, Agent, or Firm* — Finnegan, Henderson, Farabow, Garrett & Dunner LLP

(57) ABSTRACT

An apparatus for operating a storage system is provided. The apparatus is coupled with one or more storage devices and one or more controllers and comprises a data request input module configured to receive a request for data and determine a data stripe that includes the requested data. The apparatus further comprises a controller instruction module configured to instruct one or more controllers to perform a decoding of code words of the determined data stripe, wherein the code words are acquired by the controllers from the one or more storage devices, and determine, based on error status information associated with the decoding, an error handling operation on the data stripe to modify one or more code words of the data stripe. The apparatus also comprises a data packaging module configured to generate the requested data based on the modified at least one or more code words.

26 Claims, 7 Drawing Sheets

$$\begin{array}{c} \phantom{v_0} \\ \begin{array}{c} v_0 \\ v_1 \\ v_2 \\ v_3 \\ v_4 \\ v_5 \\ v_6 \\ v_7 \\ v_8 \\ v_9 \end{array} \left[ \begin{array}{ccccc} x & 0 & 0 & y & 0 \\ 0 & x & z & 0 & 0 \\ 0 & z & 0 & 0 & x \\ 0 & 0 & z & y & 0 \\ y & 0 & x & 0 & 0 \\ 0 & 0 & x & z & 0 \\ z & 0 & 0 & y & 0 \\ 0 & y & z & 0 & 0 \\ 0 & x & 0 & 0 & x \\ x & 0 & y & 0 & 0 \end{array} \right] \begin{array}{c} s_0 \\ s_1 \\ s_2 \\ s_3 \\ s_4 \end{array} \end{array}$$

FIG. 1B

METHOD AND APPARATUS FOR OPERATING A DATA STORAGE SYSTEM

TECHNICAL FIELD

The present disclosure generally relates to the field of computer technology, and more particularly, to a method and an apparatus for operating a data storage system.

BACKGROUND

The development of data storage systems has played a major role in the exponential growth of computer technologies. However, the stored data in a data storage system can become corrupted, and errors can be introduced to the stored data, due to various reasons. For example, some of the electronic components of the data storage system may fail due to manufacturing defects, aging, etc. Moreover, external events, such as a fire catastrophe, may cause physical damage to the data storage system including the electronic components that store the data. All of these can lead to corruption of data stored in the system.

There are a number of mechanisms available to mitigate the risk of data corruption. First, the data storage system can encode the data to be stored into code words. The code words may include the information carried by the data, as well as error-correction information, and the code words can be stored in lieu of (or together with) the data. After receiving a request for the stored data, the data storage system can decode the code words to provide the stored data. In the event that the stored code words are corrupted due to component failure, the data storage system can also decode the corrupted code words using the error-correction information to generate the requested data. Moreover, the data storage system can also distribute the stored data among a set of storage devices into a data stripe that includes redundancy information. When one or more of the set of storage devices fails, leading to corruption of some of the data of a data stripe, the data storage system can use uncorrupted data of the data stripe, as well as the redundancy information, to recover the lost data. Further, the data storage system may also store replicas of the data in other storage devices, and can provide the replica data in response to the data request.

A data storage system capable of providing reliable and fast access to the stored data can improve the reliability and efficiency of the computing and networking devices that use the data storage system. With the recent advances in various areas of computing and networking technologies (e.g., big data processing, cloud computing, etc.), there is a need for a data storage system that provides not only reliable storage for a gigantic amount of data, but also fast access to that data, even if the stored data is corrupted and needs to be corrected.

SUMMARY

Embodiments of the present disclosure provide an apparatus for operating a storage system. The apparatus is coupled with one or more storage devices and one or more controllers and comprises a data request input module configured to receive a request for data and determine a data stripe that includes the requested data. The apparatus further comprises a controller instruction module configured to instruct one or more controllers to perform a decoding of code words of the determined data stripe, wherein the code words are acquired by the controllers from the one or more storage devices, and determine, based on error status information associated with the decoding, an error handling operation on the data stripe to modify one or more code words of the data stripe. The apparatus also comprises a data packaging module configured to generate the requested data based on the modified at least one or more code words.

Embodiments of the present disclosure also provide a method for operating a data storage system, the method comprising: receiving a request for data; determining a data stripe that includes the requested data; instructing one or more controllers to perform a decoding of code words of the determined data stripe, wherein the code words are acquired by the controllers from one or more storage devices storing the code words; determining, based on error status information associated with the decoding, an error handling operation on the data stripe to modify one or more code words of the data stripe; and generating the requested data based on the modified at least one or more code words.

Embodiments of the present disclosure also provide a non-transitory computer readable medium that stores instructions that are executable by one or more processors of an apparatus to perform a method for operating a data storage system, the method comprising: receiving a request for data; determining a data stripe that includes the requested data; instructing one or more controllers to perform a decoding of code words of the determined data stripe, wherein the code words are acquired by the controllers from one or more storage devices storing the code words; determining, based on error status information associated with the decoding, an error handling operation on the data stripe to modify one or more code words of the data stripe; and generating the requested data based on the modified at least one or more code words.

Additional objects and advantages of the disclosed embodiments will be set forth in part in the following description, and in part will be apparent from the description, or may be learned by practice of the embodiments. The objects and advantages of the disclosed embodiments may be realized and attained by the elements and combinations set forth in the claims.

It is to be understood that both the foregoing general description and the following detailed description are exemplary and explanatory only and are not restrictive of the disclosed embodiments, as claimed.

BRIEF DESCRIPTION OF THE DRAWINGS

FIGS. 1A-1E are block diagrams illustrating an exemplary storage system consistent with embodiments of the present disclosure.

DESCRIPTION OF THE EMBODIMENTS

Figure 1A:
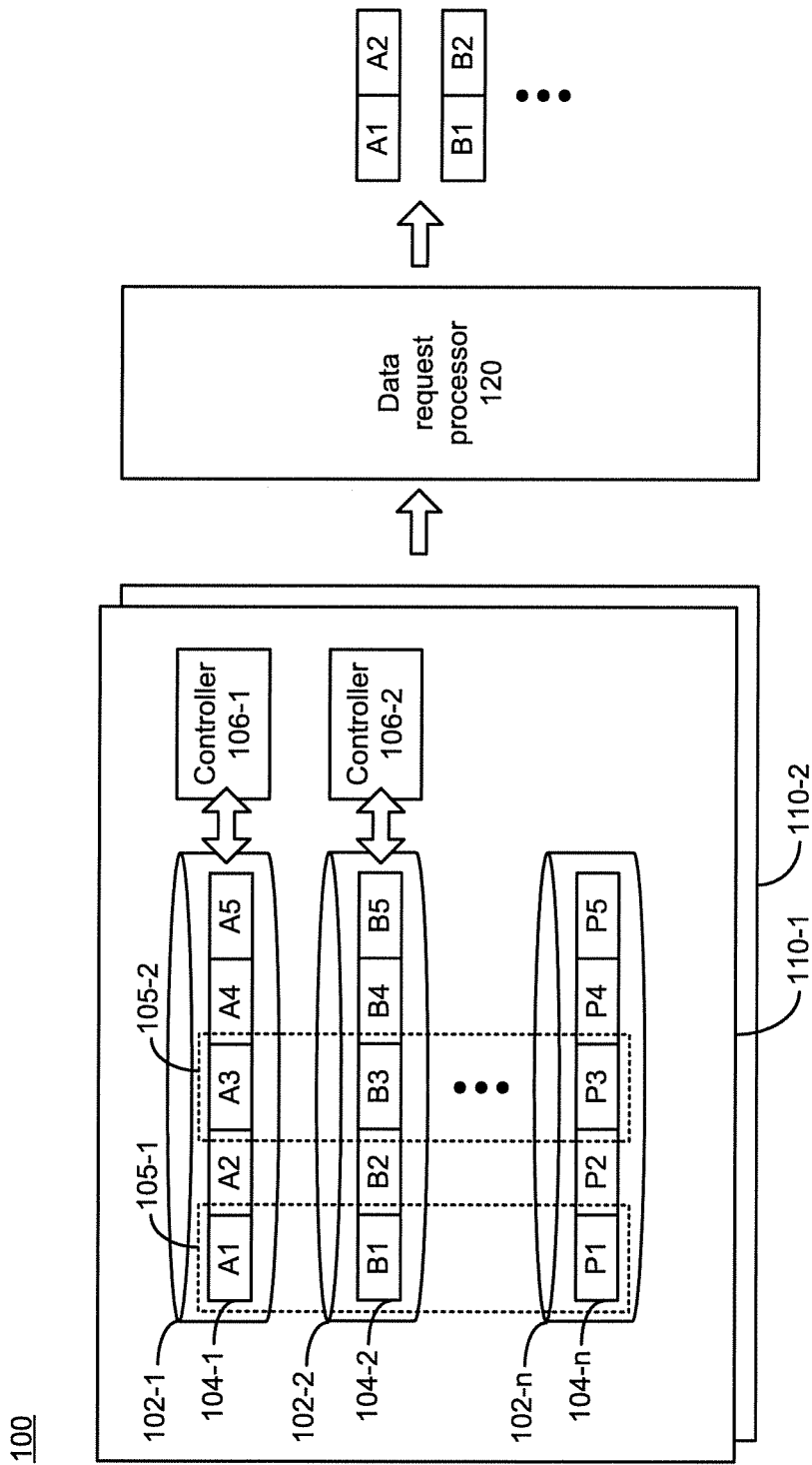

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims.

Embodiments of the present disclosure provide a data storage system. The data storage system comprises one or more storage devices and a data request processor. The one or more storage devices are configured to store at least a first code word and a second code word encoded from a piece of data. The first and second code words also form a data stripe associated with error correction information. The data request processor can receive a data request for data, and process the data request by controlling the one or more storage devices to decode the first and second code words. The decoding also includes a linear block code error correction operation that generates an error status for the first and second code words. If the error statuses indicate that the first and second code words are free of errors, the data request processor can output at least one of the first and second code words as a response to the data request. On the other hand, if the error statuses indicate that at least one of the first and second code words includes an error and that error is capable of being corrected based on the error correction information, the data request processor may perform a stripe-wise error handling operation to correct the error based on the error correction information, and output at least one of the corrected or originally correct first and second code words as a response to the data request.

With embodiments of the present disclosure, the correction of error and generation of original data can be completed more efficiently, and the response time of the system to a data request can be shortened as well. As a result, the reliability and efficiency of the computing and networking devices that use the data storage system, as well as user experience, can be improved.

According to some embodiments, the operations, techniques, and/or components described herein can be implemented by an electronic device, which can include one or more special-purpose computing devices. The special-purpose computing devices can be hard-wired to perform the operations, techniques, and/or components described herein, or can include digital electronic devices such as one or more application-specific integrated circuits (ASICs) or field programmable gate arrays (FPGAs) that are persistently programmed to perform the operations, techniques and/or components described herein, or can include one or more hardware processors programmed to perform such features of the present disclosure pursuant to program instructions in firmware, memory, other storage, or a combination. Such special-purpose computing devices can also combine custom hard-wired logic, ASICs, or FPGAs with custom programming to accomplish the technique and other features of the present disclosure. The special-purpose computing devices can be desktop computer systems, portable computer systems, handheld devices, networking devices, or any other device that incorporates hard-wired and/or program logic to implement the techniques and other features of the present disclosure.

The one or more special-purpose computing devices can be generally controlled and coordinated by operating system software, such as iOS, Android, Blackberry, Chrome OS, Windows XP, Windows Vista, Windows 7, Windows 8, Windows Server, Windows CE, Unix, Linux, SunOS, Solaris, VxWorks, or other compatible operating systems. In other embodiments, the computing device can be controlled by a proprietary operating system. Operating systems control and schedule computer processes for execution, perform memory management, provide file system, networking, I/O services, and provide a user interface functionality, such as a graphical user interface ("GUI"), among other things.

Reference is now made to FIG. 1A, which illustrates an exemplary storage system 100 consistent with embodiments of the present disclosure. Storage system 100 includes a plurality of storage devices 102-1, 102-2, 102-n, etc. Each of storage device 102-1, 102-2, and 102-n can be a separate physical storage device (e.g., a magnetic drive, a solid-state drive, etc.). Some or all of storage devices 102-1, 102-2, and 102-n can also be logical drives that are part of a single physical storage device. Each of storage devices 102-1, 102-2, and 102-n can be associated with a volume label configured to identify the storage device and a file system (e.g., New Technology File System (NTFS), File Allocation Table (FAT)) associated with the storage device.

As shown in FIG. 1A, each of storage devices 102-1, 102-2, and 102-n stores, respectively, data 104-1, data 104-2, and 104-n. Each of data 104-1 and 104-2 may include a plurality of code words (e.g., code word A1 for data 104-1, code word B1 for data 104-2, etc.). The code words may be generated by an encoder based on data for storage. As to be discussed in more details below, the encoding (and subsequent decoding to obtain the original data) may be associated with a predetermined check matrix, which may allow detection and/or correction of certain errors in the code words.

Moreover, the code words may be organized into one of more data stripes. For example, code words A1 and B1 may be a part of data stripe 105-1, whereas code words A2 and B2 may be a part of data stripe 105-2. Data 104-n may include error correction information, such as checksum information, for code words associated with a particular data stripe. For example, data 104-n may include error correction information P1, which can be a numeric sum of code words A1 and B1. As to be discussed in more details below, the error correction information of data 104-n can be used to perform stripe-wise error handling operation. Although FIG. 1A shows that code words of the same data stripe are stored in different storage devices, it is understood that code words of the same (or different) data stripe can be stored in a single storage device.

Moreover, distributed storage system 100 may also organize the storage devices into replicas 110-1 and 110-2. For example, storage devices 102-1, 102-2, and 102-n can be associated with replica 110-1, while other storage devices (not shown in FIG. 1A) can be associated with replica 110-2. Replicas 110-1 and 110-2 may store identical data, such that if the data in one of the replicas become unavailable, identical data from another one of the replicas can be retrieved as a backup.

Each of storage devices 102-1 and 102-2 can be coupled with, respectively, a controller 106-1 and 106-2. As to be discussed in more details below, the controllers include a number of modules configured to provide access to the data stored in the storage devices by, for example, decoding the code words, and outputting the decoded (or partially-decoded) code words. Moreover, storage system 100 may also maintain a directory structure (not shown in FIG. 1A) containing information about the storage locations of data 104-1 and 104-2. The information may indicate, for example, which of the storage devices stores a particular piece of data, the locations within that storage device where the piece of data is stored, which of the data stored in the storage devices form a data stripe, etc. Based on the directory structure, one or more of the controllers (e.g., controller 106-1) can be instructed to provide access to the data stored in the storage device coupled with the controller.

Referring back to FIG. 1A, storage system 100 also includes a data request processor 120. Data request processor 120 also includes a number of modules configured to process a data request, and to obtain the requested data from the storage devices (e.g., storage devices 102-1 and 102-2) of distributed storage system 100. The data request may come from, for example, another device via a network. In some embodiments, data request processor 120 can receive a data request and, based on the aforementioned directory structure information, determine which of the storage devices stores the requested data. Data request processor 120 can cause the controller of the identified storage device to decode the code words that correspond to the requested data. The decoding also generates an error status for each of the code words being decoded. Based on the error statuses, data request processor 120 may determine that the decoding of the code words is complete and free of error, and output the decoded data as a response to the data request. Moreover, based on the error statuses, data request processor 120 can also perform stripe-wise error handling operation for data stripes 105-1 and 105-2, as to be discussed in more details below.

As discussed above, data 104-1 and 104-2 stored in storage devices 102-1 and 102-2, respectively, can include a set of code words. The set of code words can be generated by encoding the data for storage according to, for example, a specific coding scheme, such as Hamming code, low-density parity-check code (LDPC), etc. As a part of the encoding, a check matrix H can be predetermined to represent certain parity constraints to be exhibited by the encoded symbols. As an illustrative example, an encoder uses a generator matrix G to encode the data for storage, and generate code word A1 of data 104-1. The code word A1 can be represented by a vector V. Vector V includes a set of ten elements $[v_0 \ v_1 \ v_2 \ v_3 \ v_4 \ v_5 \ v_6 \ v_7 \ v_8 \ v_9]^T$ forming a 10×1 matrix, where $[\ ]^T$ is the transpose of the matrix $[\ ]$. The generator matrix G can be based on a 5×10 check matrix H, which can represent a set of constraints that governs the numerical relationship among the elements of vector V. In this illustrative example, the constraints can be expressed as follows:

$$v_0 \oplus v_4 \oplus v_6 \oplus v_9 = 0 \quad \text{(Equation 1)}$$

$$v_1 \oplus v_2 \oplus v_7 \oplus v_8 = 0 \quad \text{(Equation 2)}$$

$$v_1 \oplus v_4 \oplus v_7 \oplus v_9 = 0 \quad \text{(Equation 3)}$$

$$v_0 \oplus v_3 \oplus v_5 \oplus v_6 = 0 \quad \text{(Equation 4)}$$

$$v_2 \oplus v_3 \oplus v_5 \oplus v_8 = 0 \quad \text{(Equation 5)}$$

Here, the symbol $\oplus$ in each of equations 1 to 5 represents a summation followed by a modulo 2 operation. For example, equation 1 defines a constraint such that a sum of $v_0$, $v_4$, $v_6$, and $v_9$ is to be an even number, such that the sum yields a zero remainder when divided by two.

A check matrix H that defines the constraints listed in Equations 1 to 5 can be as follows:

$$H = \begin{bmatrix} 1 & 0 & 0 & 0 & 1 & 0 & 1 & 0 & 0 & 1 \\ 0 & 1 & 1 & 0 & 0 & 0 & 0 & 1 & 1 & 0 \\ 0 & 1 & 0 & 0 & 1 & 0 & 0 & 1 & 0 & 1 \\ 1 & 0 & 0 & 1 & 0 & 1 & 1 & 0 & 0 & 0 \\ 0 & 0 & 1 & 1 & 0 & 1 & 0 & 0 & 1 & 0 \end{bmatrix} \quad \text{(Equation 6)}$$

The check matrix H can be used to derive a generator matrix G, which can be used to encode data into vector V. For example, the generator matrix G can be generated from the check matrix H in accordance with $H^T G = 0$ through basic row operations in a Galois field of two elements (GF(2)). As another example, if $H^T = [X^T | I]$, $G = [I | X^T]$, where I is an identity matrix. Given the generator matrix G, a code word V of data B may be obtained in accordance with B·G=V, where B includes bits of data to be encoded, e.g., $B = [b_0 \ b_1 \ \ldots \ b_4]$ in the above example of equation 6. All of encoding operations for encoding data into code words and encoding data stripes from the code words throughout this application can be carried out in accordance with the above generation method.

Referring back to FIG. 1A, data request processor 120 may receive a request for data that corresponds to code word A1. Based on the directory structure information, data request processor 120 may determine data 104-1 of storage device 102-1 includes the requested data, and instruct controller 106-1 to obtain the requested data. Upon receiving the instruction, controller 106-1 obtains data 104-1, which includes vector V'. As a part of decoding vector V', controller 106-1 may perform a matrix multiplication between vector V' and check matrix H, followed by a modulo 2 operation, to obtain a 5×1 syndrome matrix S, as follows:

$$H \cdot V' = S = \begin{bmatrix} s_0 \\ s_1 \\ s_2 \\ s_3 \\ s_4 \end{bmatrix} \quad \text{(Equation 7)}$$

Each entry of the syndrome matrix S can provide an indication about whether the aforementioned constraints are satisfied in vector V'. The indication can provide an error status associated with vector V'. For example, syndrome entries $s_0$, $s_1$, $s_2$, $s_3$, and $s_4$ may indicate, respectively, whether the constraints defined in equations 1, 2, 3, 4, and 5 are satisfied. A non-zero syndrome entry may indicate which of the elements included in vector V' may include errors compared with the original vector V. For example, referring to FIG. 1B, based on a determination that syndrome entry $s_1$ is non-zero, controller 106-1 can determine that at least one of elements $v_1$, $v_2$, $v_7$, and $v_8$ of vector V' is different from the corresponding elements of the original vector V.

Figure 1C:
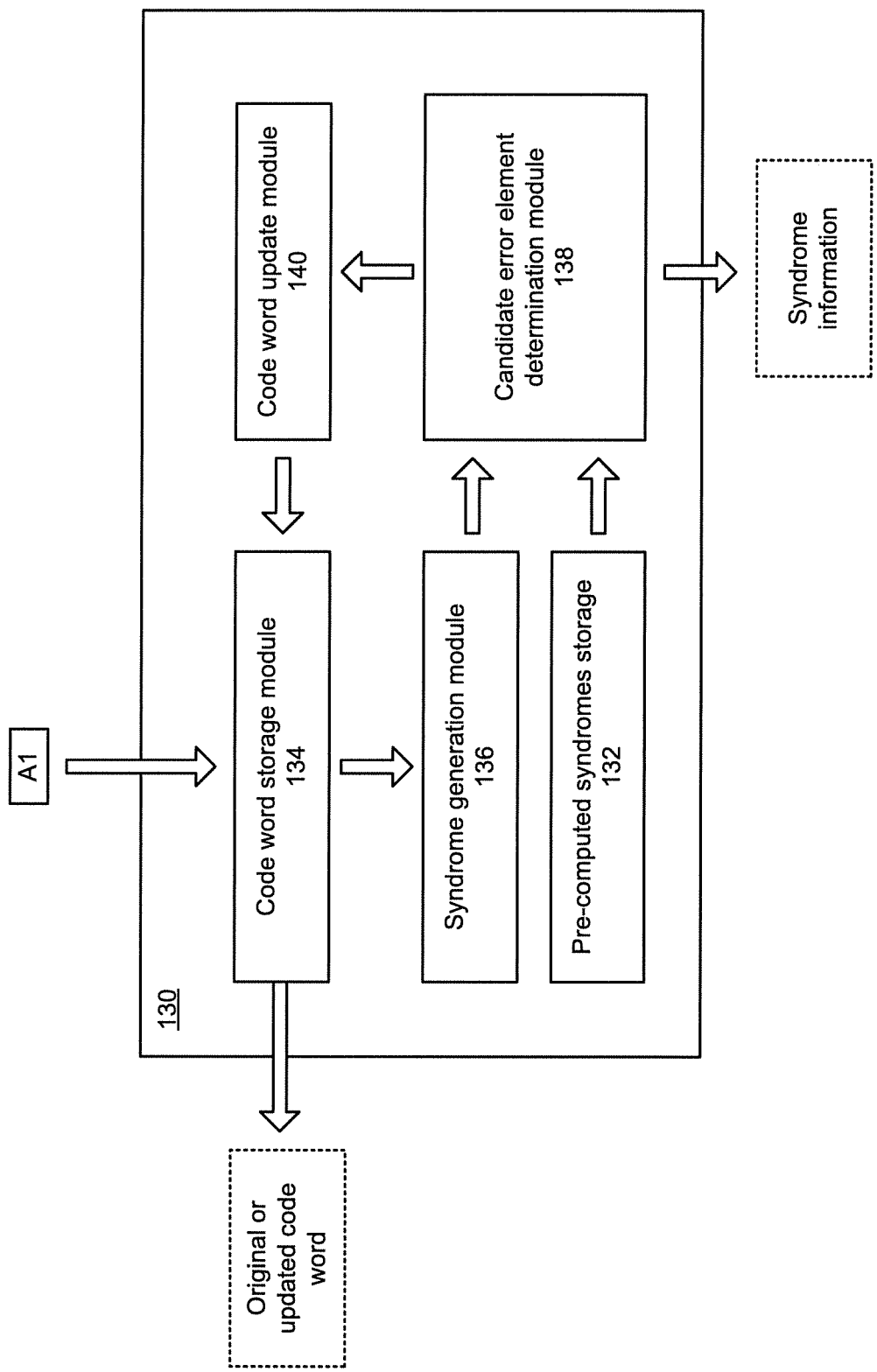

Controller 106-1 can also perform a linear block code error correction operation on vector V' based on the syndrome entries. Reference is now made to FIG. 1C, which illustrates an example of a decoder module 130 that can be a part of controller 106-1, and can determine syndromes and perform error correction based on the determined syndromes. As shown in FIG. 1C, decoder module 130 includes a pre-computed syndrome storage 132, a code word storage module 134, a syndrome generation module 136, a candidate error element determination module 138, and a code word update module 140.

In general, the word "module," as used herein, can be a packaged functional hardware unit designed for use with other components (e.g., portions of an integrated circuit) or a part of a program (stored on a computer readable medium) that performs a particular function of related functions. The module can have entry and exit points and can be written in a programming language, such as, for example, Java, Lua, C or C++. A software module can be compiled and linked into an executable program, installed in a dynamic link library, or written in an interpreted programming language such as, for example, BASIC, Perl, or Python. It will be appreciated that software modules can be callable from other modules or from themselves, and/or can be invoked in response to detected events or interrupts. Software modules configured for execution on computing devices can be provided on a computer readable medium, such as a compact disc, digital video disc, flash drive, magnetic disc, or any other non-transitory medium, or as a digital download (and can be originally stored in a compressed or installable format that requires installation, decompression, or decryption prior to execution). Such software code can be stored, partially or fully, on a memory device of the executing computing device, for execution by the computing device. Software instructions can be embedding in firmware, such as an EPROM. It will be further appreciated that hardware modules can be comprised of connected logic units, such as gates and flip-flops, and/or can be comprised of programmable units, such as programmable gate arrays or processors. The modules or computing device functionality described herein are preferably implemented as software modules, but can be represented in hardware or firmware. Generally, the modules described herein refer to logical modules that can be combined with other modules or divided into sub-modules despite their physical organization or storage.

In some embodiments, controller 106-1 may store a set of pre-computed syndromes associated with known error elements in the stored code words (e.g., code word A1) in pre-computed syndrome storage 132. During the decoding operation, after vector V' (which represents code word A1) is stored in code word storage module 134, and syndrome generation (e.g., using check matrix H according to equation 7) is performed by syndrome generation module 136 on vector V' to obtain a syndrome matrix G, candidate error element determination module 138 can compare the generated syndrome against the set of pre-computed syndromes stored in pre-computed syndrome storage 132 to find a match. Candidate error element determination module 138 then determines, based on the known error elements associated with the matching pre-computed syndromes, one or more candidate error elements in vector V'. For example, referring back to FIG. 1B, based on the matching pre-computed syndromes, candidate error element determination module 138 may determine that among elements $v_1$, $v_2$, $v_7$, and $v_8$, elements $v_1$ and $v_8$ are the most likely to have errors. Code word update module 140 can then update the candidate error elements ($v_1$ and $v_8$) of vector V' stored in code word storage module 134, and syndrome generation module 136 can regenerate the syndrome for the updated vector V'.

If all of the entries in the syndrome matrix are zero, controller 106-1 can provide the updated vector V' stored in code word storage module 134 to data request processor 120 as an output in response to a data request. Controller 106-1 can also perform additional decoding on the updated vector V' (e.g., using the generator matrix G derived from check matrix H). On the other hand, if the regenerated syndrome matrix S still contains non-zero entries, which indicates that some of the elements still contain error, candidate error element determination module 138 may update other elements of vector V' to correct the errors, and regenerate the syndrome matrix S to determine whether the errors are corrected. The error correction operation can be repeated until, for example, when the syndrome matrix S contains only zero entries, when controller 106-1 receives a time-out event to stop the operation, etc. During the error correction operation, candidate error element determination module 138 can output the most up-to-date syndrome information including a number of elements with symbols, whereas code word storage module 134 can output the most up-to-date code word. As to be discussed in more details below, both of the syndrome information and the code word (updated or not) can be used for a subsequent stripe-wise error handling operation.

Referring back to FIG. 1A, as discussed above, the code words stored in storage system 100 are also organized into one of more data stripes. A data stripe may be associated with error correction information, such as checksum information, for code words associated with that data stripe. In some embodiments, the code words associated with a data stripe can be further encoded according to a specific erasure coding scheme (e.g., Reed-Solomon codes) to generate the checksum information, which can be used to correct the errors in the encoded code words. As an illustrative example, with a Reed-Solomon code RS (255, 223) including 255 bytes of the encoded code words, of which 223 bytes are data and 32 bytes are check sum data, a Reed-Solomon decoder can correct, based on the check sum data and code words, up to 16 bytes of errors in the 223 bytes of data included in the encoded code words. In the example shown in FIG. 1A, if code words A1 and B1 of data stripe 105-1 are also generated as Reed-Solomon code including 223 bytes of data, and if error correction information P1 includes 32 bytes of check sum data, a Reed-Solomon decoder can recover up to 16 bytes of errors in code words A1 and B1 provided by, respectively, controllers 106-1 and 106-2, in a stripe-wise error handling operation. The Reed-Solomon decoder can be a part of data request processor 120, or can be a module separated from but controlled by data request processor 120.

Figure 1D:
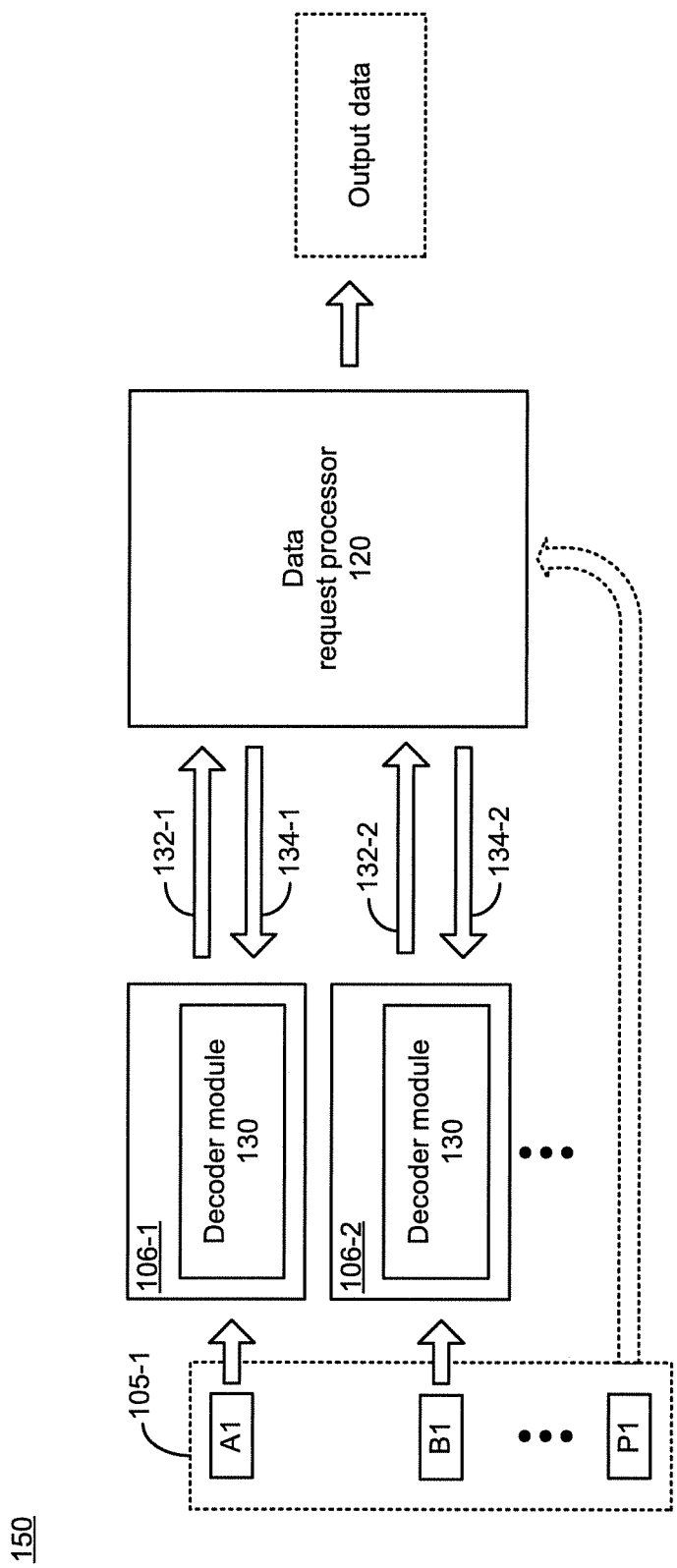

Reference is now made to FIG. 1D, which illustrates an example of a stripe-wise error handling operation 150 performed by data request processor 120. Here, code words A1 and B1 of data stripe 105-1 are generated from the original data by first being encoded as a data stripe using, for example, a Reed-Solomon encoder to generate error correction information P1. The resultant code words are then further encoded using another encoder (e.g., an LDPC encoder) based on a predetermined check matrix, to obtain code words A1 and B1.

After receiving a data request, data request processor 120 can instruct decoder modules 130 in controllers 106-1 and 106-2 to perform decoding of code words A1 and B1, which may include the linear block code error handling operation as described in FIG. 1C (if the code words include errors). During the decoding operation, controller 106-1 can transmit information 132-1 including the most up-to-date decoding result of code word A1, and the associated syndrome information, to data request processor 120. Moreover, controller 106-2 can also transmit information 132-2 including the most up-to-date decoding result of code word B1, and the associated syndrome information, to data request processor 120. The syndrome information in information 132-1 and 132-2 may include, for example, a number of elements included in code words A1 and/or B1 with errors. Information 132-1 and 132-2 may also include an identifier configured to identify a data stripe (e.g., data stripe 105-1, data stripe 105-2, etc.), which enables data request processor 120 to keep track of a number of code word errors in each of the data stripes being decoded by controllers 106-1, 106-2, etc.

Based on the syndrome information included in information 132-1 and 132-2, data request processor 120 can determine a total number of errors in data stripe 105-1. Data request processor 120 may also determine an error threshold. The error threshold can be determined based on, for example the stripe-wise encoding scheme. In the illustrative example discussed above, if data stripe 105-1 is encoded using Reed-Solomon code RS (255, 223) scheme, the error threshold can be 16 bytes. If the total number of errors equals to or is below the error threshold, data request processor 120 may determine that the errors can be corrected using error correction information P1. In that case, data request processor 120 may perform the decoding of data stripe 105-1 (as well as code words A1 and B1) using error correction information P1.

On the other hand, if the total number of errors meets or exceeds the error threshold, data request processor 120 may transmit instructions 134-1 and 134-2 to, respectively, controller 106-1 and 106-2, to control at least one of controllers 106-1 and 106-2 to continue the linear block code decoding operation as described in FIG. 1C. The linear block code error correction operations can continue until, for example, the total number of errors in the data stripe is reduced to become equal to or fall below the error threshold. Data request processor 120 can then perform the stripe-wise error correction operation.

In some cases, data request processor 120 may also stop the linear block code error correction operation at controllers 106-1 and 106-2, even when the total number of errors in the data stripe remains above the error threshold. For example, data request processor 120 may include an internal timer configured to track a total amount of time spent on the error correction operations, and may determine to stop the error correction operations when the timer expires. The internal timer may be configured based on, for example, a target response time for the data request processor 120 to respond to a data request. Upon expiration of the timer, data request processor 120 may determine which of the code words include errors, and obtain a copy of those code words from a replica storage device (e.g., replica 110-2). As another example, data request processor 120 may also determine that the number of errors in a particular code word exceeds the capability of linear block code error handling operation (e.g., by predicting that the number of errors in the code word will not be reduced to below a threshold upon expiration of the target response time). In that case, data request processor 120 may determine to forgo the error handling operation, to conserve computing resources.

Figure 1E:
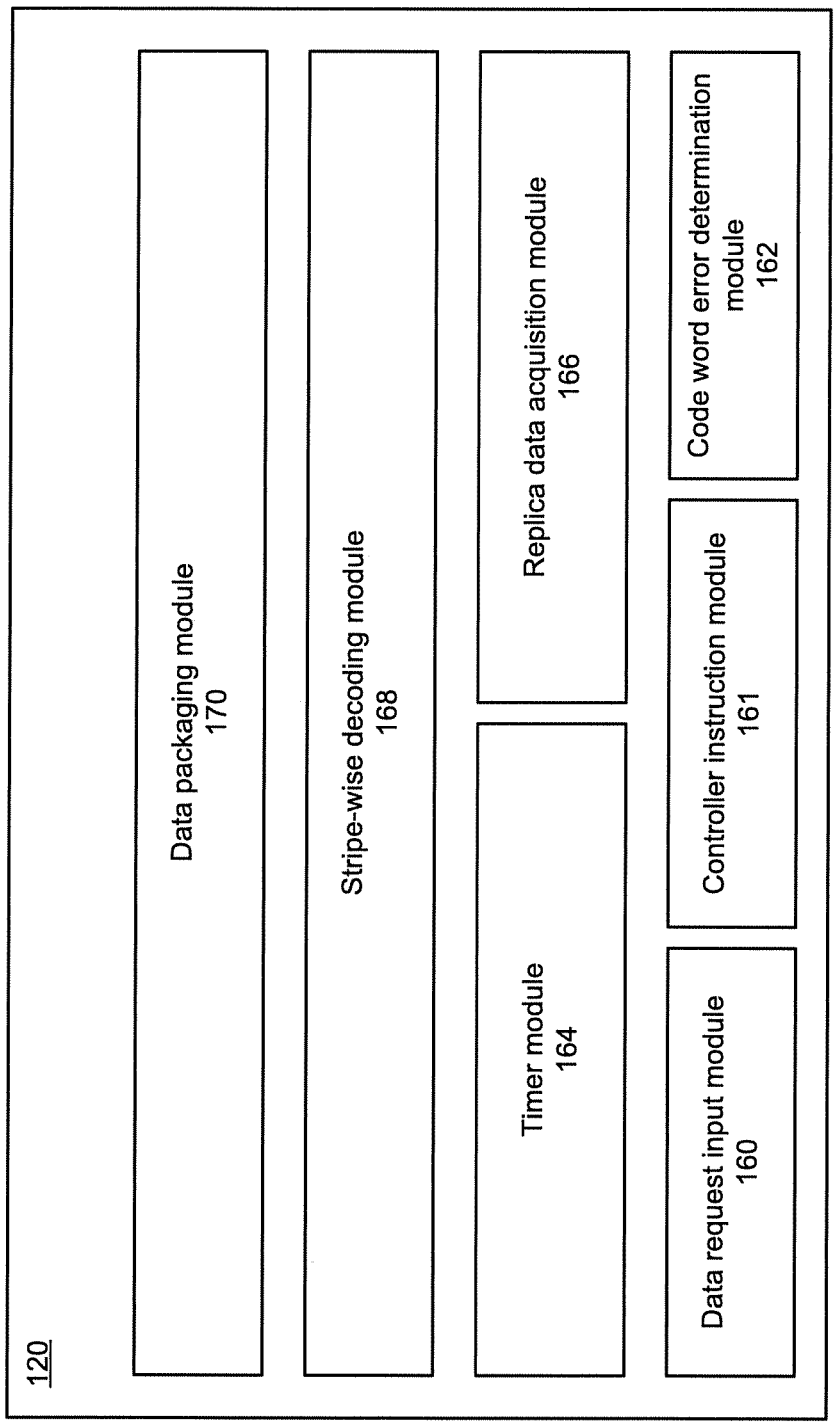

Reference is now made to FIG. 1E, which illustrates an example of components of data request processor 120, consistent with embodiments of the present disclosure. As shown in FIG. 1E, data request processor 120 includes a data request input module 160, a controller instruction module 161, a code word error determination module 162, a timer module 164, a replica data acquisition module 166, a stripe-wise decoding module 168, and a data packaging module 170.

Data request input module 160 can receive a data request and determine, based on directory structure information, a data stripe that includes the requested data, and the storage devices that store the code words of the data stripe. Controller instruction module 161 can instruct the storage device that stores the data stripe to perform linear block code decoding of the code words included in the data stripe, as described above with respect to FIG. 1C.

Code word error determination module 162 can obtain error status information associated with the linear block code error correction operations of code words of the data stripe (e.g., information 132-1 and 132-2 of FIG. 1D). Based on the error status information, code word error determination module 162 can determine a number of errors in the data stripe. For example, based on the identifier and the syndrome information included in, for example, information 132-1 and 132-2 received from, respectively, controllers 106-1 and 106-2, code word error determination module 162 can determine a number of code words with errors in a particular data stripe (e.g., data stripe 105-1). Code word error determination module 162 can determine the number of errors in the data stripe as, for example, the number of code words with error in that data stripe. Code word error determination module 162 can also update the number of errors based on updated syndrome information provided by the controllers.

Moreover, timer module 164 includes a timer configured to keep track of how much time has elapsed since data request processor 120 last received a data request. For example, timer module 164 can start the timer when data request input module 160 receives the data request, and compare the timer value against a timer threshold that indicates the time allocated for responding to the data request. When the timer value equals the timer threshold, timer module 164 may generate a timer expiration indication.

Based on the outputs of code word error determination module 162 and timer module 164, controller instruction module 161 can instruct the controllers to either continue the linear block code error correction operations, or to stop the operations. For example, based on a number of code words with errors in a particular data stripe, controller instruction module 161 may determine that the number of errors is below or equal to the aforementioned error threshold for stripe-wise error handling operation. Moreover, based on the indication of timer expiration in timer module 164, controller instruction module 161 may also determine that the allocated time for responding to the data request (and for correcting the errors) has been spent. Further, based on the number of code words with errors and the amount of time left for the processing, controller instruction module 161 may also determine that there are too many code word errors to be corrected by linear block code error correction operations. In all these cases, controller instruction module 164 can transmit instructions (e.g., instructions 134-1 and 134-2) to the controllers to stop the decoding (and the linear block code error handling operation).

If the total number of errors in the data stripe is equal to or below an error threshold for stripe-wise error handling, such that the errors can be corrected by stripe-wise decoding, controller instruction module 161 can provide an indication to stripe-wise decoding module 168 to perform stripe-wise decoding and stripe-wise error handling operation on the data stripe, as described above. On the other hand, if the total number of errors in the data stripe exceeds the error threshold for stripe-wise error handling, controller instruction module 161 can provide an indication to replica data acquisition module 166 to obtain a replica of the code words with errors (or a replica of the data stripe) from replica 110-2, and to provide the replica for stripe-wise decoding.

On the other hand, controller instruction module 161 may also determine that the number of errors exceeds the aforementioned error threshold for stripe-wise error handling operation, but the number of errors can be further reduced to become equal to or the aforementioned error threshold for stripe-wise error handling before the timer expires. For example, controller instruction may determine a rate at which the number of errors is reduced during the decoding action, and predict that at such a rate, the number of errors can be further reduced to become equal to or the aforementioned error threshold for stripe-wise error handling before the timer expires. Based on this prediction, controller instruction module 161 can transmit instructions (e.g., instructions 134-1 and 134-2) to the controllers to continue the decoding and the linear block code error handling operations. Controller instruction module 161 may continue sending instructions to continue the decoding and linear block code error handling operations until the total number of errors equals or falls below the error threshold, or when the timer expires.

After stripe-wise decoding module 168 completes the decoding of the data stripe, data packaging module 170 can perform additional processing of the decoded data, and provide the processed data in response to the data request. The additional processing may include, for example, extracting part of the data according to the request, formatting the data for provisioning, etc. For example, based on the aforementioned directory structure information, data packaging module 170 can identify the exact location of the requested data and, based on the identified location, determine which code words of the decoded data stripe are to be provided in response to the data request. Data packaging module 170 can then extract those code words (in decoded form) and provide the extracted data in response to the data request. Data packaging module 170 may perform additional processing, such as generating data packets to encapsulate the extracted code words for transmission over a network, converting the extracted code words to a specific data format associated with the data request, etc.

Figure 2:
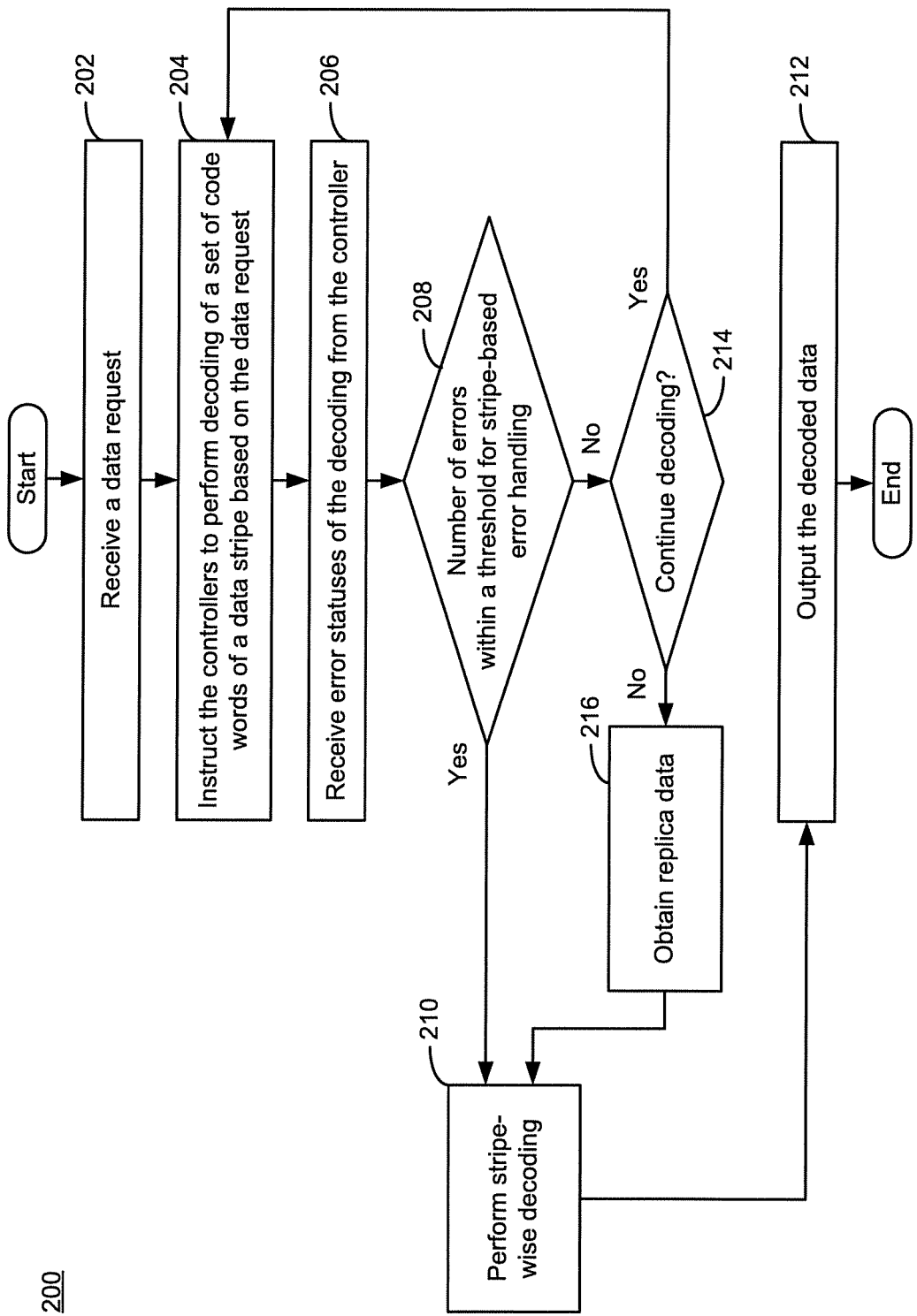
FIG. 2 is a flowchart illustrating an exemplary method of operating a storage system consistent with embodiments of the present disclosure.

FIG. 2 is a flowchart representing an exemplary method 300 for operating a data storage, consistent with embodiments of the present disclosure. It will be readily appreciated that the illustrated procedure can be altered to delete steps or further include additional steps. Method 200 can be performed by a data request processor (e.g., data request processor 120 of FIG. 1A) that communicates with one or more controllers (e.g., controllers 106-1 and 106-2, etc.) that manage one or more storage devices (e.g., storage devices 104-1, 104-2, and 104-n, etc.).

After an initial start, the data request processor receives a data request, in step 202. Based on directory structure information, the data request processor can identify and a data stripe (e.g., data stripe 105-1) that includes the requested data, in step 203.

The data request processor then instructs the controllers that manage a set of storage devices that stores code words of the data stripe to decode the code words, in step 204. The decoding at the controller may include the aforementioned linear block code error handling operations, and may generate one or more error statuses associated with the error handling operations.

After receiving the error statuses information from the controller (in step 206), the data request processor may determine whether the number of errors in the data stripe equals or falls below an error threshold for stripe-based error handling, in step 208. If the data request processor determines that the number of errors in the data stripe equals or falls below the error threshold for stripe-based error handling (which includes no errors), the data request processor can then perform stripe-wise decoding of the data stripe (which may also include stripe-wise error handling operations), in step 210. The data request processor can then output the decoded data in response to data request, in step 212.

On the other hand, if the data request processor determines that the number of errors in the data stripe exceeds below the error threshold (in step 208), the data request processor can determine whether to continue decoding, in step 214. The determination can be based on, for example, whether the allocated time for processing the data request has been spent, whether there are too many errors to be corrected by the linear block code handling operation, etc. For example, as discussed above, based on the indication of timer expiration in timer module 162, the data request processor may also determine that the allocated time for responding to the data request (and for correcting the errors) has been spent, and determine not to continue the decoding in step 214. Further, based on the number of code words with errors and the amount of time left for the processing, the data request processor may also determine that there are too many code word errors to be corrected by linear block code error correction operations, and determine not to continue the decoding in step 214. The data request processor can then obtain replica data (e.g., replica code words, replica data stripe, etc.) from other replica drives (in step 216), and perform stripe-wise decoding based on the replica data, in step 210. On the other hand, if the data request processor determines to continue the decoding (in step 214), it may proceed back to step 204 to continue instructing the controllers to perform the decoding.

Figure 3:
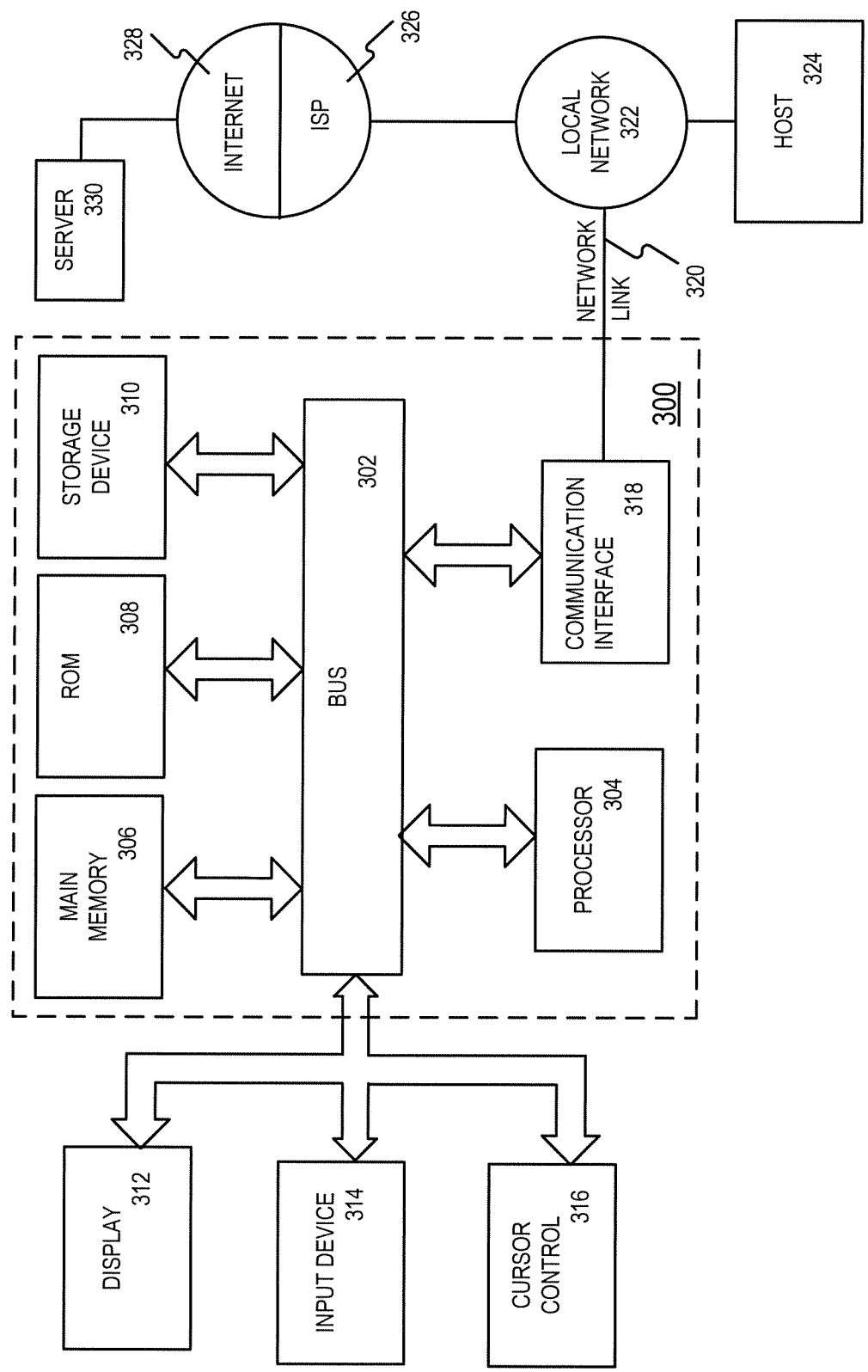
FIG. 3 is a block diagram illustrating an exemplary computer system on which embodiments described herein can be implemented.

FIG. 3 is a block diagram of an exemplary computer system 300 with which embodiments described herein can be implemented. Computer system 300 includes a bus 302 or other communication mechanism for communicating information, and one or more hardware processors 404 (denoted as processor 304 for purposes of simplicity) coupled with bus 302 for processing information. Hardware processor 304 can be, for example, one or microprocessors.

Computer system 300 also includes a main memory 306, such as a random access memory (RAM) or other dynamic storage device, coupled to bus 302 for storing information and instructions to be executed by processor 304. Main memory 306 also can be used for storing temporary variables or other intermediate information during execution of instructions to be executed by processor 304. Such instructions, after being stored in non-transitory storage media accessible to processor 304, render computer system 300 into a special-purpose machine that is customized to perform the operations specified in the instructions.

Computer system 300 further includes a read only memory (ROM) 308 or other static storage device coupled to bus 302 for storing static information and instructions for processor 304. A storage device 310, such as a magnetic disk, optical disk, or USB thumb drive (Flash drive), etc., is provided and coupled to bus 302 for storing information and instructions.

Computer system 400 can be coupled via bus 302 to a display 312, such as a cathode ray tube (CRT), an liquid crystal display (LCD), or a touch screen, for displaying information to a computer user. An input device 314, including alphanumeric and other keys, is coupled to bus 302 for communicating information and command selections to processor 304. Another type of user input device is cursor control 316, such as a mouse, a trackball, or cursor direction keys for communicating direction information and command selections to processor 304 and for controlling cursor movement on display 312. The input device typically has two degrees of freedom in two axes, a first axis (for example, x) and a second axis (for example, y), that allows the device to specify positions in a plane. In some embodiments, the same direction information and command selections as cursor control may be implemented via receiving touches on a touch screen without a cursor.

Computing system 300 can include a user interface module to implement a graphical user interface (GUI) that can be stored in a mass storage device as executable software codes that are executed by the one or more computing devices. This and other modules can include, by way of example, components, such as software components, object-oriented software components, class components and task components, processes, functions, fields, procedures, subroutines, segments of program code, drivers, firmware, microcode, circuitry, data, databases, data structures, tables, arrays, and variables. The modules may include, for example, components of decoder module 130 of FIG. 1C and data request processor 120 of FIG. 1E.

Computer system 300 can implement the techniques described herein using customized hard-wired logic, one or more ASICs or FPGAs, firmware and/or program logic which in combination with the computer system causes or programs computer system 300 to be a special-purpose machine. According to some embodiments, the operations, functionalities, and techniques and other features described herein are performed by computer system 300 in response to processor 304 executing one or more sequences of one or more instructions contained in main memory 306. Such instructions can be read into main memory 306 from another storage medium, such as storage device 310. Execution of the sequences of instructions contained in main memory 306 causes processor 304 to perform the method steps (e.g., method 200 of FIG. 2) described herein. In alternative embodiments, hard-wired circuitry can be used in place of or in combination with software instructions.

The term "non-transitory media" as used herein refers to any non-transitory media storing data and/or instructions that cause a machine to operate in a specific fashion. Such non-transitory media can comprise non-volatile media and/or volatile media. Non-volatile media can include, for example, optical or magnetic disks, such as storage device 310. Volatile media can include dynamic memory, such as main memory 306. Non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, flash memory, register, cache, any other memory chip or cartridge, and networked versions of the same.

Non-transitory media is distinct from, but can be used in conjunction with, transmission media. Transmission media can participate in transferring information between storage media. For example, transmission media can include coaxial cables, copper wire and fiber optics, including the wires that comprise bus 302. Transmission media can also take the form of acoustic or light waves, such as those generated during radio-wave and infra-red data communications.

Various forms of media can be involved in carrying one or more sequences of one or more instructions to processor 304 for execution. For example, the instructions can initially be carried on a magnetic disk or solid state drive of a remote computer. The remote computer can load the instructions into its dynamic memory and send the instructions over a telephone line using a modem. A modem local to computer system 300 can receive the data on the telephone line and use an infra-red transmitter to convert the data to an infra-red signal. An infra-red detector can receive the data carried in the infra-red signal and appropriate circuitry can place the data on bus 302. Bus 302 carries the data to main memory 306, from which processor 304 retrieves and executes the instructions. The instructions received by main memory 306 can optionally be stored on storage device 310 either before or after execution by processor 304.

Computer system 400 can also include a communication interface 318 coupled to bus 302. Communication interface 318 can provide a two-way data communication coupling to a network link 320 that can be connected to a local network 322. For example, communication interface 318 can be an integrated services digital network (ISDN) card, cable modem, satellite modem, or a modem to provide a data communication connection to a corresponding type of telephone line. As another example, communication interface 318 can be a local area network (LAN) card to provide a data communication connection to a compatible LAN. Wireless links can also be implemented. In any such implementation, communication interface 318 can send and receive electrical, electromagnetic or optical signals that carry digital data streams representing various types of information.

Network link 320 can typically provide data communication through one or more networks to other data devices. For example, network link 320 can provide a connection through local network 322 to a host computer 324 or to data equipment operated by an Internet Service Provider (ISP) 326. ISP 326 in turn can provide data communication services through the world wide packet data communication network now commonly referred to as the "Internet" 328. Local network 322 and Internet 328 both use electrical, electromagnetic or optical signals that carry digital data streams. The signals through the various networks and the signals on network link 320 and through communication interface 318, which carry the digital data to and from computer system 300, can be example forms of transmission media.

Computer system 300 can send messages and receive data, including program code, through the network(s), network link 320 and communication interface 318. In the Internet example, a server 330 can transmit a requested code for an application program through Internet 328, ISP 326, local network 322 and communication interface 318.

The received code can be executed by processor 304 as it is received, and/or stored in storage device 310, or other non-volatile storage for later execution. In some embodiments, server 330 can provide information for being displayed on a display.

It will be appreciated that the present invention is not limited to the exact construction that has been described above and illustrated in the accompanying drawings, and that various modifications and changes can be made without departing from the scope thereof. It is intended that the scope of the invention should only be limited by the appended claims.

What is claimed is:

1. An apparatus coupled with a storage system comprising a plurality of storage devices and a plurality of controllers respectively corresponding to the plurality of storage devices, the apparatus comprising:
   a data request input module configured to receive a request for data and determine a data stripe that includes the requested data, wherein the data stripe includes a plurality of code words acquired respectively from the plurality of storage devices;
   a controller instruction module configured to:
      instruct the plurality of controllers to perform a decoding of the plurality of code words of the determined data stripe, wherein the decoding of the plurality of code words includes a linear block code error handling operation that includes a multiplication of each of the plurality of code words with a matrix, and determine, based on error status information generated based on the multiplications, an error handling operation on the data stripe to correct one or more code words of the plurality of code words of the data stripe; and a data packaging module configured to generate the requested data based on the corrected one or more code words.

2. The apparatus of claim 1, wherein each of the plurality of code words is represented, by a vector, and the matrix is a check matrix.

3. The apparatus of claim 1, wherein determining an error handling operation on the data stripe to correct one or more code words of the plurality of code words of the data stripe comprises the controller instruction module being configured to:

determine, based on the error status information, whether a total number of errors included in the plurality of code words of the data stripe exceeds an error threshold; and responsive to the determination that the total number of errors exceeds the error threshold, instruct the plurality of controllers to continue the decoding of the plurality of code words to reduce the total number of errors.

4. The apparatus of claim 3, further comprising a stripe-wise decoding module; wherein determining an error handling operation on the data stripe to correct one or more code words of the plurality of code words of the data stripe comprises the controller instruction module being configured to:

responsive to the determination that the total number of errors equals to or falls below the error threshold:
instruct the plurality of controllers to stop the decoding of the plurality of code words, and
cause the stripe-wise decoding module to perform a stripe-wise error handling operation on the data stripe to correct the one or more code words of the plurality of code words based on other code words of the data stripe.

5. The apparatus of claim 1, wherein determining an error handling operation on the data stripe to correct one or more code words of the plurality of code words of the data stripe further comprises the controller instruction module being configured to:

responsive to the determination that a predetermined amount of time has elapsed since the request for data was received, instruct the plurality of controllers to stop the decoding of the plurality of code words.

6. The apparatus of claim 5, further comprising a replica data acquisition module; wherein determining an error handling operation on the data stripe to correct one or more code words of the plurality of code words of the data stripe further comprises the controller instruction module being configured to:

after the instructing of the plurality of controllers to stop the decoding of the plurality of code words to reduce the total number of errors, determine whether the corrected one or more code words include an error; and responsive to the determination that the corrected one or more code words include an error, causing the replica data acquisition module to obtain a replica of the one or more code words from a replica storage device.

7. The apparatus of claim 1, wherein the plurality of code words are low-density parity-check (LDPC) codes;
wherein the data stripe is generated from an erasure code encoder based on the plurality of code words; and
wherein the error threshold is based on an attribute of the erasure code.

8. A method for operating a data storage system comprising a plurality of storage devices and a plurality of controllers respectively corresponding to the plurality of storage devices, the method comprising:

receiving a request for data;

determining a data stripe that includes the requested data, wherein the data strip includes a plurality of code words acquired respectively from the plurality of storage devices;

instructing the plurality of controllers to perform a decoding of the plurality of code words of the determined data stripe, wherein the decoding of the plurality of code words includes a linear block code error handling operation that includes a multiplication of each of the plurality of code words with a matrix;

determining, based on error status information generated based on the multiplications, an error handling operation on the data stripe to correct one or more code words of the plurality of code words of the data stripe; and generating the requested data based on the corrected one or more code words.

9. The method of claim 8, wherein each of the plurality of code words is represented by a vector, and the matrix is a check matrix.

10. The method of claim 8, wherein determining an error handling operation on the data stripe to correct one or more code words of the plurality of code words of the data stripe comprises:

determining, based on the error status information, whether a total number of errors included in the plurality of code words of the data stripe exceeds an error threshold; and responsive to determining that the total number of errors exceeds the error threshold, instructing the plurality of controllers to continue the decoding of the plurality of code words to reduce the total number of errors.

11. The method of claim 10, wherein determining an error handling operation on the data stripe to correct one or more code words of the plurality of code words of the data stripe comprises:

responsive to determining that the total number of errors equals to or falls below the error threshold:
instructing the plurality of controllers to stop the decoding of the code words, and
performing a stripe-wise error handling operation on the data stripe to correct the one or more code words of the plurality of code words based on other code words of the data stripe.

12. The method of claim 8, wherein determining an error handling operation on the data stripe to correct one or more code words of the plurality of code words of the data stripe further comprises:

responsive to determining that a predetermined amount of time has elapsed since the request for data was received, controlling the plurality of controllers to stop the decoding of the code words.

13. The method of claim 12, wherein determining an error handling operation on the data stripe to correct one or more code words of the plurality of code words of the data stripe further comprises:

after controlling the plurality of controllers to stop the decoding of the code words to reduce the total number of errors, determining whether the corrected one or more code words include an error; and responsive to determining that the corrected one or more code words include an error, obtaining a replica of the at least one code word from a replica storage device.

14. The method of claim 8, wherein the plurality of code words are low-density parity-check (LDPC) codes;
wherein the data stripe is generated from an erasure code encoder based on the plurality of code words; and
wherein the error threshold is based on an attribute of the erasure code.

15. A method for operating a data storage system, the method comprising:
receiving, by a storage device of the data storage system, data to be stored;
encoding the received data into a plurality of code words for error correction, wherein encoding the received data into the plurality of code words includes encoding the received data in accordance with a linear block code;
obtaining a plurality of data stripes from the plurality of code words, wherein each of the plurality of data stripes includes a corresponding one of the plurality of code words and one or more other code words from one or more storage devices other than the storage device;
encoding the plurality of data stripes for error correction; and
storing the plurality of encoded data stripes in the data storage system.

16. The method of claim 15, wherein the linear block code includes one of an LDPC code, a Reed-Solomon code, a BCH code, or a Hamming code.

17. The method of claim 15, wherein encoding the plurality of data stripes includes encoding the plurality of data stripes in accordance with an erasure code.

18. A non-transitory computer-readable medium storing instructions that are executable by one or more processors of an apparatus to perform a method for operating a data storage system, the method comprising:
receiving a request for data;
determining a data stripe that includes the requested data, wherein the data stripe includes a plurality of code words acquired respectively from the plurality of storage devices;
instructing a plurality of controllers to respectively perform a decoding of the plurality of code words of the determined data stripe, wherein the decoding of the plurality of code words includes a linear block code error handling operation that includes a multiplication of each of the plurality of code words with a matrix; and
determining, based on error status information generated based on the multiplications, an error handling operation on the data stripe to correct one or more code words of the plurality of code words of the data stripe; and
generating the requested data based on the corrected one or more code words.

19. The non-transitory computer-readable medium of claim 18, wherein each of the plurality of code words is represented by a vector, and the matrix is a check matrix.

20. The non-transitory computer-readable medium of claim 18, wherein determining an error handling operation on the data stripe to correct one or more code words of the plurality of code words of the data stripe comprises the set of instructions that is executable by the one or more processors of the apparatus to cause the apparatus to further perform:
determining, based on the error status information, whether a total number of errors included in the plurality of code words of the data stripe exceeds an error threshold; and
responsive to determining that the total number of errors exceeds the error threshold, instructing the plurality of controllers to continue the decoding of the plurality of code words to reduce the total number of errors.

21. The non-transitory computer-readable medium of claim 18, wherein determining an error handling operation on the data stripe to correct one or more code words of the plurality of code words of the data stripe comprises the set of instructions that is executable by the one or more processors of the apparatus to cause the apparatus to further perform:
responsive to determining that the total number of errors equals to or falls below the error threshold:
instructing the plurality of controllers to stop the decoding of the plurality of code words, and
performing a stripe-wise error handling operation on the data stripe to correct the one or more code words of the plurality of code words based on other code words of the data stripe.

22. The non-transitory computer-readable medium of claim 18, wherein determining an error handling operation on the data stripe to correct one, or more code words of the plurality of code words of the data stripe further comprises the set of instructions that is executable by the one or more processors of the apparatus to cause the apparatus to further perform:
responsive to determining that a predetermined amount of time has elapsed since the request for data was received, controlling the plurality of controllers to stop the decoding of the plurality of code words.

23. The non-transitory computer-readable medium of claim 22, wherein determining an error handling operation on the data stripe to correct one or more code words of the plurality of code words of the data stripe further comprises the set of instructions that is executable by the one or more processors of the apparatus to cause the apparatus to further perform:
after controlling the one or more controllers to stop the decoding of the code words to reduce the total number of errors, determining whether the corrected one or more code words include an error; and
responsive to determining that the corrected one or more code words include an error, obtaining a replica of the at least one code word from a replica storage device.

24. A non-transitory computer-readable medium storing instructions that are executable by one or more processors of an apparatus to perform a method for operating a data storage system, the method comprising:
receiving, by a storage device of the data storage system, data to be stored;
encoding the received data into a plurality of code words for error correction, wherein encoding the received data into the plurality of code words includes encoding the received data in accordance with a linear block code;
obtaining a plurality of data stripes from the plurality of code words, wherein each of the plurality of data stripes includes a corresponding one of the plurality of code words and one or more other code words from one or more storage devices other than the storage device;
encoding the plurality of data stripes for error correction; and
storing the plurality of encoded data stripes in the data storage system.

25. The non-transitory computer-readable medium of claim 24, wherein the linear block code includes one of an LDPC code, a Reed-Solomon code, a BCH code, or a Hamming code.

26. The non-transitory computer-readable medium of claim 24, wherein encoding the plurality of data stripes includes encoding the plurality of data stripes in accordance with an erasure code.

\* \* \* \* \*